(12) United States Patent
Lo et al.

(10) Patent No.: US 7,988,332 B2
(45) Date of Patent: Aug. 2, 2011

(54) INTEGRALLY FORMED SINGLE PIECE LIGHT EMITTING DIODE LIGHT WIRE

(75) Inventors: Paul Lo, Kowloon (HK); Teddy Yeung Man Lo, Kowloon (HK); Eddie Ping Kuen Li, Ma On Shan (HK)

(73) Assignee: Huizhou Light Engine Ltd., Huizhou (CN)

( * ) Notice: Subject to any disclaimer, the term of this patent is extended or adjusted under 35 U.S.C. 154(b) by 455 days.

(21) Appl. No.: 11/854,145

(22) Filed: Sep. 12, 2007

(65) Prior Publication Data

US 2008/0137332 A1 Jun. 12, 2008

Related U.S. Application Data

(60) Provisional application No. 60/844,184, filed on Sep. 12, 2006.

(51) Int. Cl.
*F21S 4/00* (2006.01)
*F21V 5/00* (2006.01)
*F21V 23/00* (2006.01)
*F21V 31/00* (2006.01)

(52) U.S. Cl. .............. 362/249.05; 362/249.02; 362/246; 362/267

(58) Field of Classification Search ............ 362/429, 362/249.02, 249.04, 249.08, 249.12, 249.05, 362/249.13, 246, 267
See application file for complete search history.

(56) References Cited

U.S. PATENT DOCUMENTS

| | | | |
|---|---|---|---|
| 4,546,041 A | 10/1985 | Keane et al. | |
| 4,761,720 A | 8/1988 | Solow | |
| 5,848,837 A | 12/1998 | Gustafson | |
| 5,927,845 A | 7/1999 | Gustafson et al. | |
| 5,941,626 A | 8/1999 | Yamuro | |
| 6,074,074 A * | 6/2000 | Marcus | 362/240 |
| 6,113,248 A | 9/2000 | Mistopoulos et al. | |
| 6,541,800 B2 | 4/2003 | Barnett et al. | |

(Continued)

FOREIGN PATENT DOCUMENTS

CN 1170109 A 1/1998

(Continued)

OTHER PUBLICATIONS

Feb. 14, 2008 PCT International Search Report and the Written Opinion of the International Searching Authority issued in connection with related PCT International Application PCT/EP2007/007948.

(Continued)

*Primary Examiner* — Alan Cariaso
(74) *Attorney, Agent, or Firm* — Dickstein Shapiro LLP

(57) ABSTRACT

A flexible, integrally formed single piece light emitting diode (LED) light wire that provides a smooth, uniform lighting effect from all directions of the LED light wire. The integrally formed single piece LED light wire contains a conductive base comprising first and second bus elements formed from a conductive material. The bus elements distribute power from a power source to LEDs that are mounted on the first and second bus elements so that it draws power from and adds mechanical stability to the first and second bus elements. The flexible, integrally formed single piece LED light wire is assembled so that the first and second bus elements are connected to each other prior to the LED being mounted and such integrally formed single piece LED light wire is formed without a substrate.

9 Claims, 19 Drawing Sheets

U.S. PATENT DOCUMENTS

| | | | |
|---|---|---|---|
| 6,604,841 B2 * | 8/2003 | Liu | 362/235 |
| 6,673,277 B1 | 1/2004 | Joseph et al. | |
| 6,673,292 B1 | 1/2004 | Gustafson et al. | |
| 6,777,891 B2 * | 8/2004 | Lys et al. | 315/291 |
| 6,840,655 B2 | 1/2005 | Shen | |
| 7,021,792 B2 * | 4/2006 | Lin | 362/249.06 |
| 7,128,438 B2 * | 10/2006 | Ratcliffe | 362/236 |
| 7,140,751 B2 * | 11/2006 | Lin | 362/249.02 |
| 7,235,815 B2 | 6/2007 | Wang | |
| 7,273,300 B2 * | 9/2007 | Mrakovich | 362/249.01 |
| 7,465,056 B2 * | 12/2008 | Peng | 362/85 |
| 2001/0036082 A1 | 11/2001 | Kanesaka | |
| 2004/0037079 A1 | 2/2004 | Luk | |
| 2005/0036310 A1 | 2/2005 | Fan | |
| 2005/0077525 A1 | 4/2005 | Lynch et al. | |
| 2005/0104059 A1 | 5/2005 | Friedman et al. | |
| 2006/0180827 A1 | 8/2006 | Wang | |
| 2009/0154156 A1 | 6/2009 | Lo et al. | |

FOREIGN PATENT DOCUMENTS

| | | |
|---|---|---|
| CN | 2708092 Y | 7/2005 |
| DE | 100 51 528 A1 | 5/2002 |
| DE | 202 16 833 U1 | 3/2004 |
| EP | 0760448 | 3/1997 |
| EP | 0 898 442 A1 | 2/1999 |
| EP | 0 911 573 A2 | 4/1999 |
| WO | WO 98/10219 | 3/1998 |
| WO | WO 01/25681 | 4/2001 |
| WO | WO-02/098182 A2 | 12/2002 |
| WO | WO 2008/031580 A1 | 3/2008 |

OTHER PUBLICATIONS

Notification of Transmittal of the International Search Report and the Written Opinion of the International Searching Authority, or the Declaration dated May 29, 2009 in connection with related PCT Application No. PCT/EP2009/050581.

International Search Report dated May 29, 2009 in connection with related PCT Application No. PCT/EP2009/050581.

Written Opinion of the International Searching Authority dated May 29, 2009 in connection with related PCT Application No. PCT/EP2009/050581.

First Office Action issued by China's State Intellectual Property Office dated Nov. 27, 2009 in connection with Chinese Patent Application No. 200780001712.3.

PCT Notification of Transmittal of the International Search Report and the Written Opinion of the International Searching Authority, or the Declaration issued in connection with related PCT International Application No. PCT/EP2010/0051784 dated Oct. 14, 2010.

PCT International Search Report issued in connection with related PCT International Application No. PCT/EP2010/0051784 dated Oct. 14, 2010.

* cited by examiner

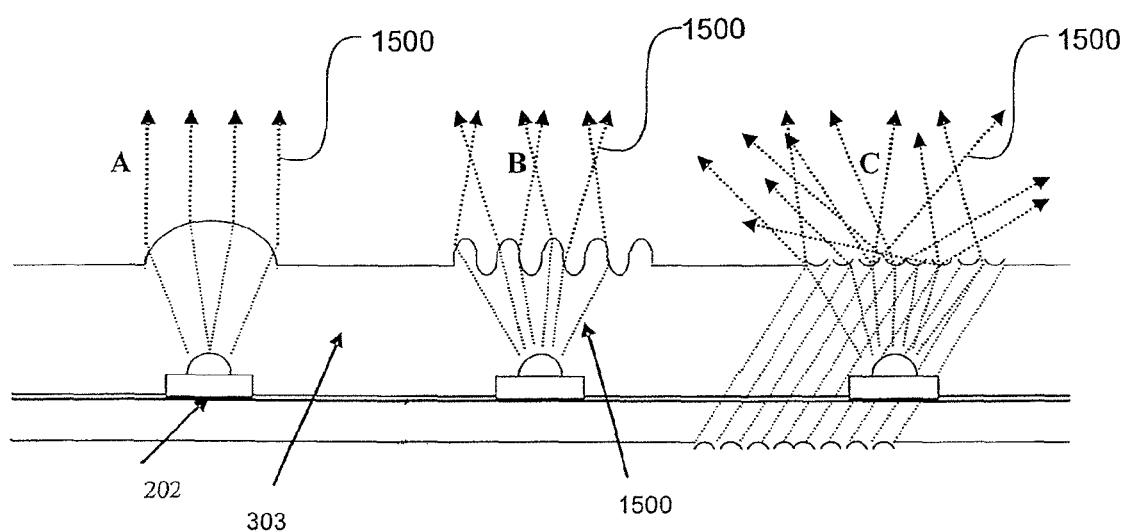
FIGURES 15A-C

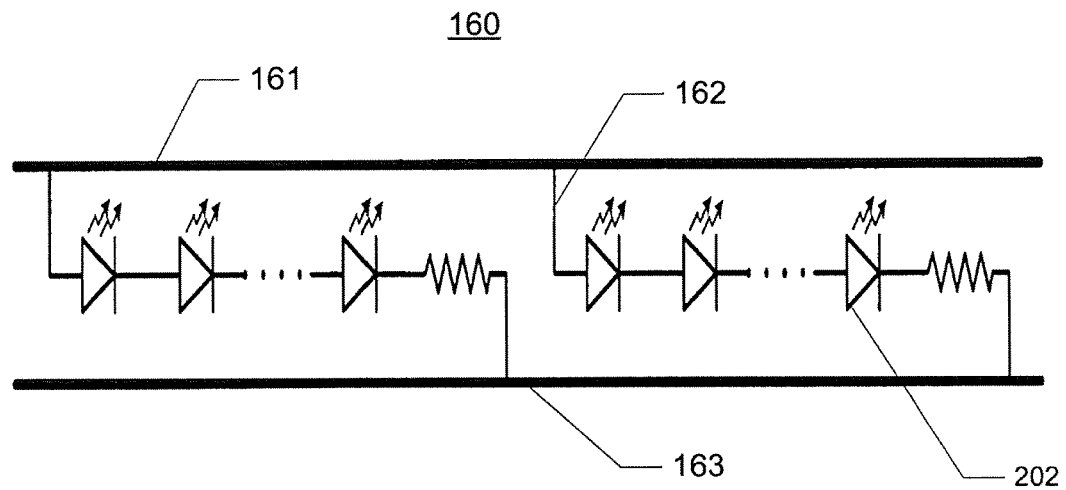
FIGURE 16A
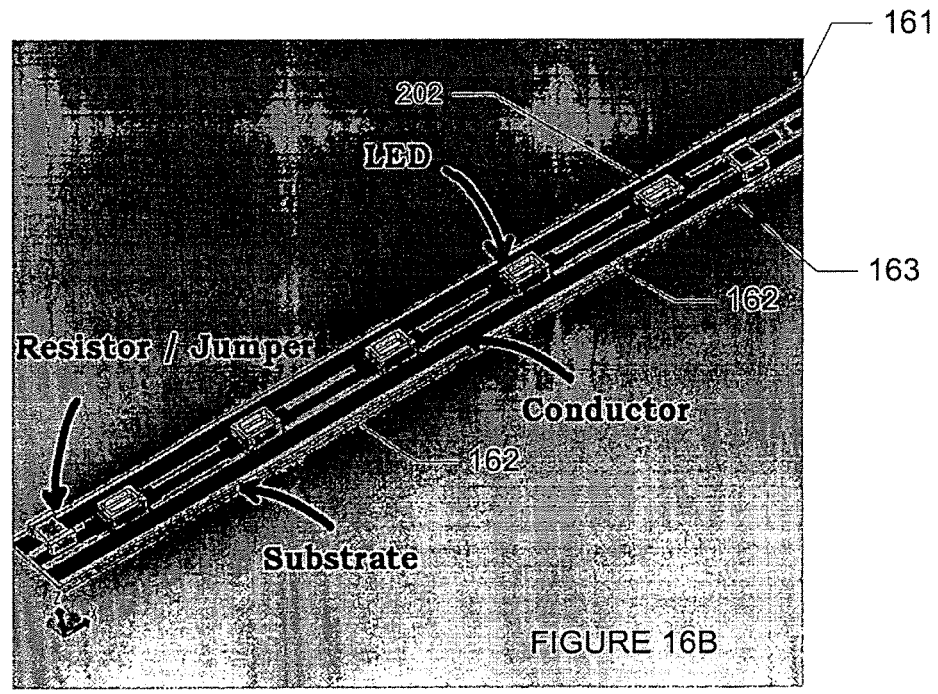

FIGURE 17
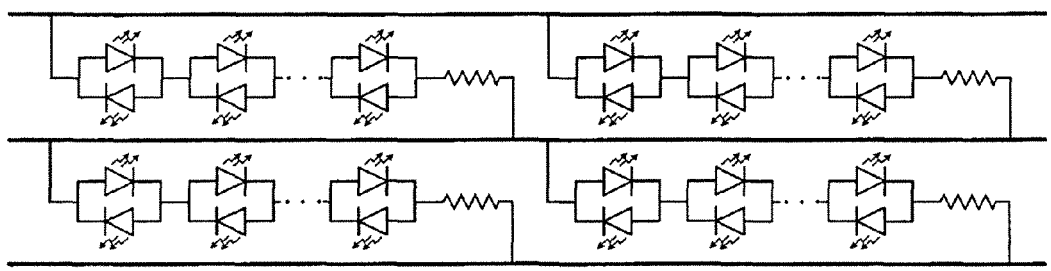
FIGURE 18
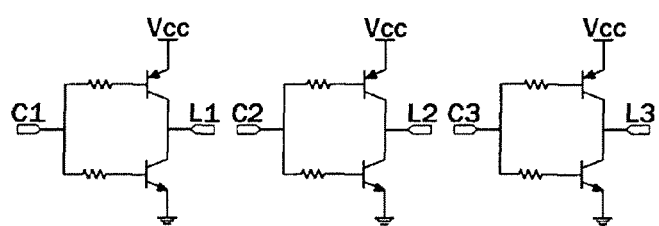
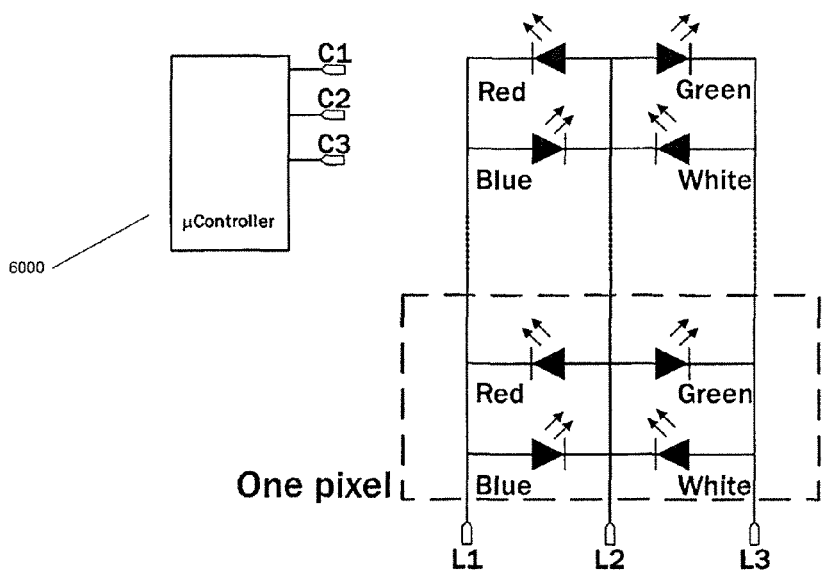

2100

INTEGRALLY FORMED SINGLE PIECE LIGHT EMITTING DIODE LIGHT WIRE

CROSS-REFERENCE TO RELATED APPLICATIONS

This is a utility application claiming priority under 35 U.S.C. §119(e) to U.S. Provisional Patent Application Ser. No. 60/844,184, filed Sep. 12, 2006, the entirety of which is incorporated herein by reference.

Throughout this application, several publications are referenced. Disclosure of these references in their entirety is hereby incorporated by reference into this application.

The present invention relates to light wires and, more specifically, an integrally formed single piece of light wire containing light emitting diodes ("LEDs"), and systems and processes for manufacturing such a light wire, wherein the LEDs and associated circuitry are protected from mechanical damage and environmental hazards, such as water and dust.

BACKGROUND THE INVENTION

Conventional incandescent or LED light wires are commonly used in a variety of indoor and outdoor decorative or ornamental lighting applications. For example, such conventional light wires are used to create festive holiday signs, outline architectural structures such as buildings or harbors, and provide under-car lighting systems. These light wires are also used as emergency lighting aids to increase visibility and communication at night or when conditions, such as power outages, water immersion and smoke caused by fires and chemical fog, render normal ambient lighting insufficient for visibility.

Conventional LED light wires consume less power, exhibit a longer lifespan, are relatively inexpensive to manufacture, and are easier to install when compared to light tubes using incandescent light bulbs. More increasingly, LED light wires are used as viable replacements for neon light tubing.

As illustrated in FIG. 1, conventional light wire 100 consists of a plurality of illuminant devices 102, such as incandescent light bulbs or LEDs, connected together by a flexible wire 101 and encapsulated in a protective tube 103. A power source 105 creates an electrical current that flows through the flexible wire 101 causing the illuminant devices 102 to illuminate and create an effect of an illuminated wire. The illuminant devices 102 are connected in series, parallel, or in combination thereof. Also, the illuminant devices 102 are connected with control electronics in such a way that individual illuminant devices 102 may be selectively switched on or off to create a combination of light patterns, such as strobe, flash, chase, or pulse.

In conventional light wires, the protective tube 103 is traditionally a hollow, transparent or semi-transparent tube which houses the internal circuitry (e.g., illuminant devices 102; flexible wire 101). Since there is an air gap between the protective tube 103 and internal circuitry, the protective tube 103 provides little protection for the light wire against mechanical damage due to excessive loads, such as the weight of machinery that is directly applied to the light wire. Furthermore, the protective tube 103 does not sufficiently protect the internal circuitry from environmental hazards, such as water and dust. As a result, these conventional light wires 100 with protective tube 103 are found unsuitable for outdoor use, especially when the light wires are exposed to extreme weather and/or mechanical abuse.

In conventional light wires, wires, such as flexible wire 101, are used to connect the illuminant devices 102 together. In terms of manufacturing, these light wires are traditionally pre-assembled using soldering or crimp methods and then encapsulated via a conventional sheet or hard lamination process in protective tube 103. Such processes of manufacturing are labor intensive and unreliable. Furthermore, such processes decrease the flexibility of the light wire.

In response to the above-mentioned limitations associated with the above-mentioned conventional light wires and the manufacture thereof, LED light strips have been developed with increased complexity and protection. These LED light strips consist of circuitry including a plurality of LEDs mounted on a support substrate containing a printed circuit and connected to separate electrical conductors (e.g., two separate conductive bus elements). The LED circuitry and the electrical conductors are encapsulated in a protective encapsulant without internal voids (which includes gas bubbles) or impurities, and are connected to a power source. These LED light strips are manufactured by an automated system that includes a complex LED circuit assembly process and a soft lamination process. Examples of these LED light strips and the manufacture thereof are discussed in U.S. Pat. Nos. 5,848,837, 5,927,845 and 6,673,292, all entitled "Integrally Formed Linear Light Strip With Light Emitting Diode"; U.S. Pat. No. 6,113,248, entitled "Automated System For Manufacturing An LED Light Strip Having An Integrally Formed Connected"; and U.S. Pat. No. 6,673,277, entitled "Method of Manufacturing a Light Guide".

Although these LED light strips are better protected from mechanical damage and environmental hazards, these LED light strips require additional separate parts, such as a support substrate and two separate conductive bus elements, to construct its internal LED circuitry. Also, to manufacture these LED light strips, additional manufacturing steps, such as purification steps, and equipment are required to assemble the complex LED circuit and painstakingly remove internal voids and impurities in the protective encapsulant. Such additional procedures, parts and equipment increase manufacturing time and costs.

Additionally, just like the conventional light wires discussed above, these LED light strips only provide one-way light direction. Moreover, the complexity of the LED circuitry and lamination process makes the LED light strip too rigid to bend.

SUMMARY OF THE INVENTION

In light of the above, there exists a need to further improve the art. Specifically, there is a need for an improved integrally formed single piece LED light wire that is flexible and provides a smooth, uniform lighting effect from all directions of the integrally formed single piece LED light wire. There is also a need to reduce the number of separate parts required to produce the integrally formed single piece LED light wire. Furthermore, there is also a need for an LED light wire that requires less procedures, parts, and equipment and can therefore be manufactured by a low cost automated process.

An integrally formed single piece LED light wire, comprises a conductive base comprising first and second bus elements formed from a conductive material adapted to distribute power from a power source. At least one light emitting diode (LED) having first and second electrical contacts is mounted on the first and second bus elements so that it draws power from and adds mechanical stability to the first and second bus elements. The first and second bus elements are connected to each other prior to the LED being mounted. The integrally formed single piece LED light wire is formed without a substrate.

According to an embodiment of the integrally formed single piece LED light wire, an encapsulant completely encapsulating the first and second bus elements, and the at least one LED.

According to an embodiment of the integrally formed single piece LED light wire, the encapsulant is textured.

According to an embodiment of the integrally formed single piece LED light wire, the encapsulant includes light scattering particles.

According to an embodiment of the integrally formed single piece LED light wire, a plurality of LEDs, are connected in series.

According to an embodiment of the integrally formed single piece LED light wire, a plurality of LEDs are connected in series and parallel.

According to an embodiment of the integrally formed single piece LED light wire, the first and second bus elements are separated after at least one LED is mounted.

According to an embodiment of the integrally formed single piece LED light wire, a connection between the LED and one of the first and second bus elements is made using solder, welding, or conductive epoxy.

According to an embodiment of the integrally formed single piece LED light wire, a connection between the LED and either the first or second bus elements is made using solder, welding, wire bonding, and conductive epoxy.

According to an embodiment of the integrally formed single piece LED light wire, includes a third bus element formed from a conductive material adapted to distribute power from the power source a plurality of LEDs, a first set LEDs are connected in series and parallel between the first and second bus elements and a second set LEDs are connected in series and parallel between the second and third bus elements.

According to an embodiment of the integrally formed single piece LED light wire, an anode of a first LED is connected to the first bus element and a cathode of the first LED is connected to the second bus element, an anode of a second LED is connected to the second bus element and a cathode of the second LED is connected to the third bus element, and a cathode of a third LED is connected to the first bus element and an anode of the first LED is connected to the second bus element.

According to an embodiment of the integrally formed single piece LED light wire, a cathode of a fourth LED is connected to the second bus element and an anode of the fourth LED is connected to the third bus element.

According to an embodiment of the integrally formed single piece LED light wire, the LEDs are selected from red, blue, green, and white LEDs.

According to an embodiment of the integrally formed single piece LED light wire includes a controller adapted to vary the power provided to the first, second, and third bus elements.

According to an embodiment of the integrally formed single piece LED light wire includes a core about which the conductive base is wound in a spiral manner.

According to an embodiment an integrally formed single piece LED light wire includes a first bus element formed from a conductive material adapted to distribute power from a power source, a second bus element formed from a conductive material adapted to distribute power from the power source, a third bus element formed from a conductive material adapted to distribute a control signal, at least one light emitting diode (LED) module, said LED module comprising a microcontroller and at least one LED, the LED module having first, second, and third electrical contacts, the LED module being mounted on the first, second, and third bus elements so that it draws power from the first and second bus elements and receives a control signal form the third bus element, wherein the integrally formed single piece LED light wire is formed without a substrate.

According to an embodiment of the integrally formed single piece LED light wire, the LED module has a plurality of LEDs selected from the group consisting of red, blue, green, and white LEDs.

According to an embodiment of the integrally formed single piece LED light wire, the LED module includes a fourth contact for outputting the received control signal.

According to an embodiment of the integrally formed single piece LED light wire includes an encapsulant completely encapsulating said first, second, and third bus elements, and said at least one LED module.

According to an embodiment of the integrally formed single piece LED light wire, each LED module has a unique address.

According to an embodiment of the integrally formed single piece LED light wire, the LED module has a static address.

According to an embodiment of the integrally formed single piece LED light wire, the LED module address is dynamic.

An integrally formed single piece LED light wire, comprising: first and second bus elements formed from a conductive material adapted to distribute power from a power source; at least two conductor segments arranged between the first and second bus elements; and at least one light emitting diode (LED), said LED having first and second electrical contacts, the first electrical contact being connected to a first conductor segment and the second electrical contact being connected to a second conductor segment; wherein the first and second conductor segments are coupled to the first and second bus elements to power the LED.

According to an embodiment of the integrally formed single piece LED light wire, includes a flexible substrate, the first and second conductor segments and the first and second bus elements, being supported by the flexible substrate.

According to an embodiment of the integrally formed single piece LED light wire, wherein flexible substrate is wound about a core.

DESCRIPTION OF THE FIGURES

FIGS. 15A-C depict a cross-sectional view of three different surface textures of the encapsulant;

FIG. 16A is a schematic diagram of an integrally formed single piece LED light wire;

FIG. 16B depicts an embodiment of an integrally formed single piece LED light wire;

FIG. 17 is a schematic diagram of a full color integrally formed single piece LED light wire;

FIG. 18 is a schematic diagram of a control circuit for a full color integrally formed single piece LED light wire;

DETAILED DESCRIPTION OF THE INVENTION

The present invention relates to an integrally formed single piece LED light wire containing a plurality of LEDs that are connected to conductors forming a mounting base or conductors supported on insulating material to provide a combined mounting base. Both types of mounting base provides an (1) electrical connection, (2) a physical mounting platform or a mechanical support for the LEDs, and (3) a light reflector for the LEDs. The mounting base and LEDs are encapsulated in a transparent or semi-transparent encapsulant which may contain light scattering particles.

Figure 1:
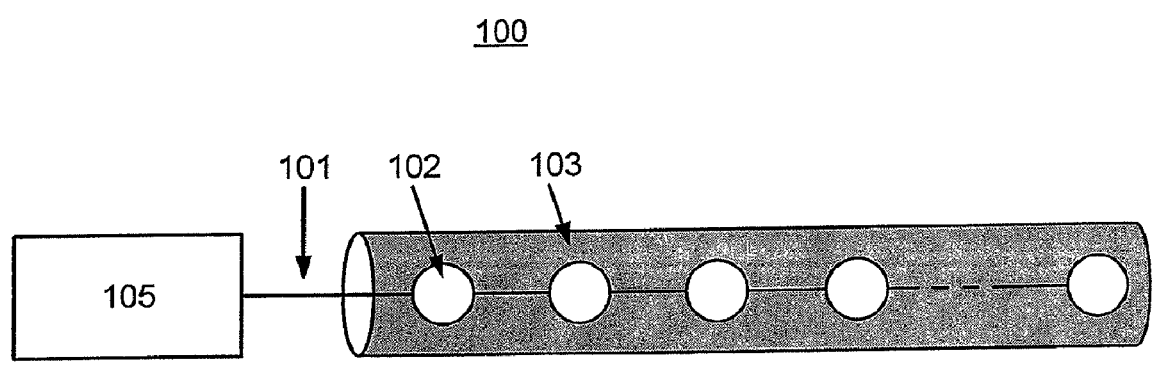
FIG. 1 is a representation of a conventional light wire.
Figure 2:
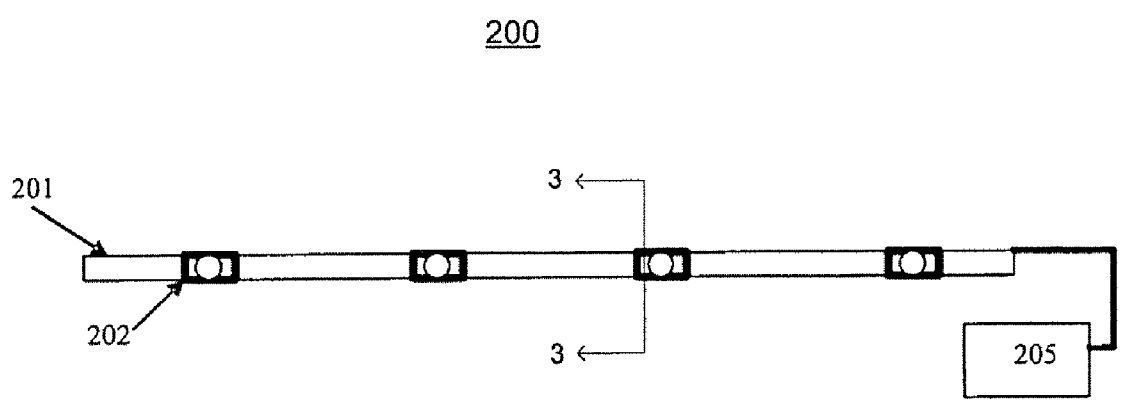
FIG. 2 is a perspective view illustrating an integrally formed single piece LED light wire according to an embodiment of the present invention.
Figure 3:
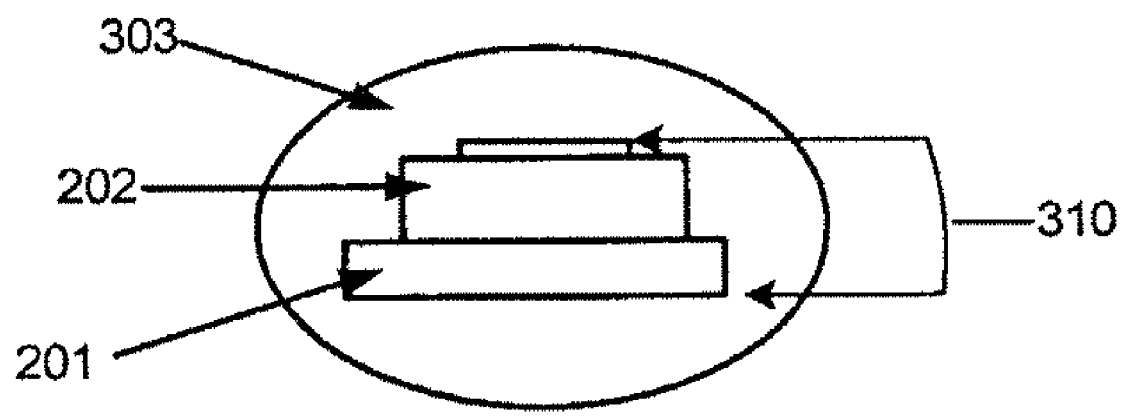
FIG. 3 is a cross-sectional view of an embodiment of the integrally formed single piece LED light wire according to the present invention.

In one embodiment of the present invention, as shown in FIGS. 2 and 3, an integral single piece LED light wire, which includes a sub-assembly 310 comprising at least one LED 202 connected to a conductive base 201, wherein the sub-assembly 310 is encapsulated within an encapsulant 303. As shown in FIG. 2, the LEDs 202 are connected in series. This embodiment offers the advantage of compactness in size, and allows the production of a long, thin LED light wire with an outer diameter of 3 mm or less. The conductive base 201, is operatively connected to a power source 205, to conduct electricity.

Figures 4A, 4B:
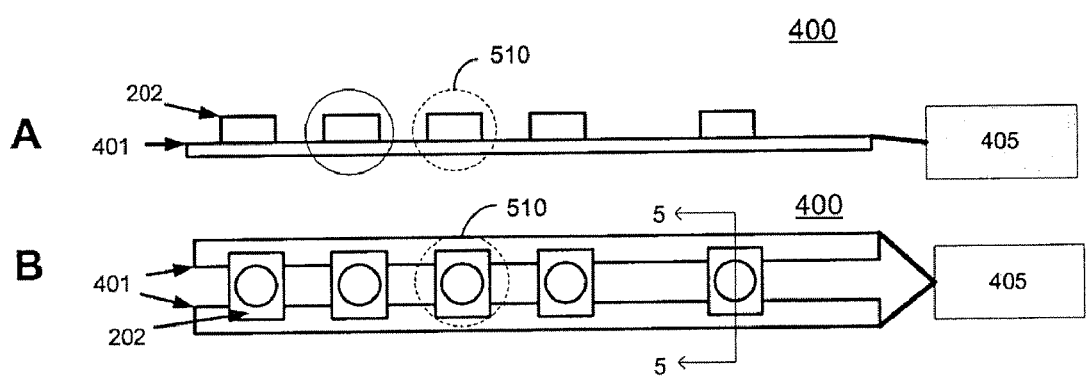
FIG. 4A is a side view of an integrally formed single piece LED light wire according to another embodiment of the present invention.
FIG. 4B is a top view of an integrally formed single piece LED light wire according to another embodiment of the present invention.
Figure 5:
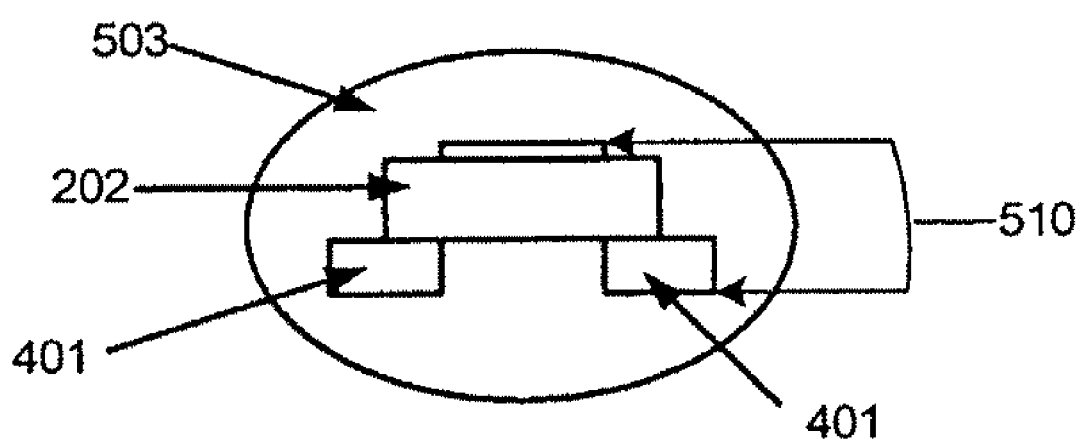
FIG. 5 is a cross-sectional view of the integrally formed single piece LED light wire shown in FIGS. 4A & 4B.

In another embodiment, as illustrated in FIGS. 4A, 4B, and 5, the present invention may be an integrally formed single piece LED light wire 400 comprising a plurality of sub-assemblies 510. Each sub-assembly 510 consists of at least one LED 202 connected to a conductive base 401. The sub-assemblies 510 are encapsulated within an encapsulant 503. As shown, the LEDs 202 are connected in parallel. The conductive base 401 is operatively connected to a power source 405 to activate LEDs 202.

AC or DC power from power source 405 may be used to power the integrally formed single piece LED light wire. Additionally, a current source may be used. Brightness may be controlled by digital or analog controllers.

The conductive base 201, 401 extends longitudinally along the length of the integrally formed single piece LED light wire, and act as an (1) electrical conductor, (2) a physical mounting platform or a mechanical support for the LEDs 202, and (3) a light reflector for the LEDs 202.

The conductive base 201, 401 may be, for example, punched, stamped, printed, silk-screen printed, or laser cut, or the like, from a metal plate or foil to provide the basis of an electrical circuit, and may be in the form of a thin film or flat strip. In another embodiment, the conductive base 201, 401, is formed using stranded wire. Additional circuitry, such as active or passive control circuit components (e.g., a microprocessor, a resistor, a capacitor), may be added and encapsulated within an encapsulant to add functionality to the integrally formed single piece LED light wire. Such functionality may include, but not limited to, current limiting (e.g., resistor), protection, flashing capability, or brightness control. For example, a microcontroller may be included to make the LEDs 202 individually addressable; thereby, enabling the end user to control the illumination of selective LEDs 202 in the LED light wire to form a variety of light patterns, e.g., strobe, flash, chase, or pulse. In one embodiment, external control circuitry is connected to the conductive base 201, 401.

The conductive base 201, 401 may be flexible or rigid, and is made of, but not limited to, thin film PCB material, conductive rod, copper plate, copper clad steel plate, copper clad alloy, or a base material coated with a conductive material.

First Embodiment of the Conductive Base

Figure 6A:
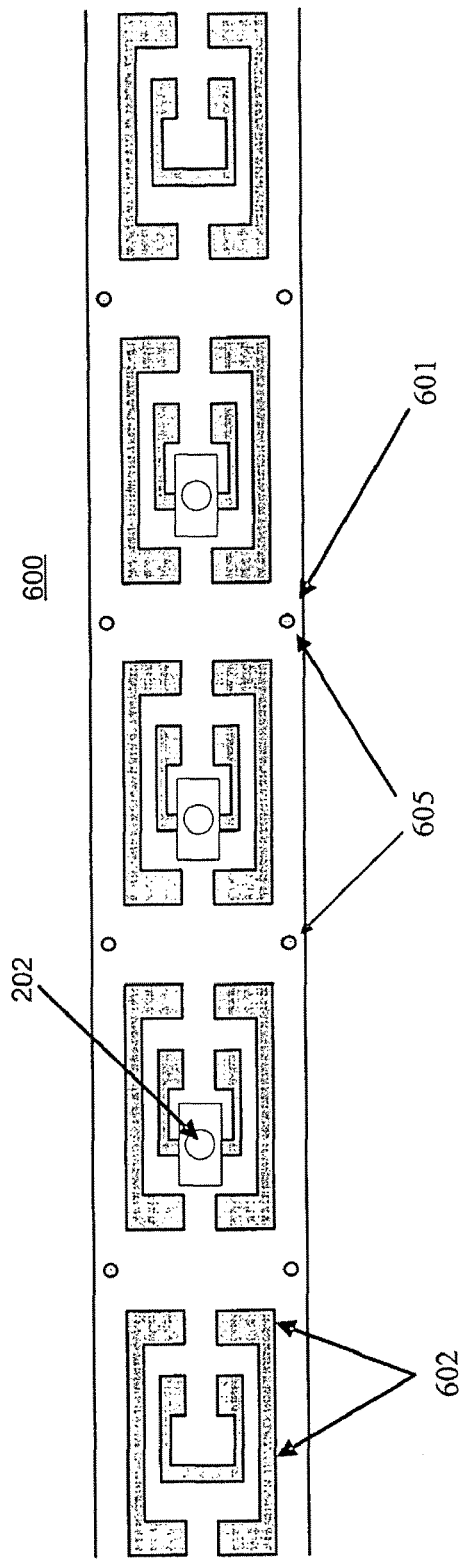
FIG. 6A is an embodiment of the conductive base.

In a first embodiment of the conductive base assembly 600, shown in FIG. 6A, the base material of the conductive base 601 is preferably a long thin narrow metal strip or foil. In one embodiment, the base material is copper. A hole pattern 602, shown as the shaded region of FIG. 6A, depict areas where material from the conductive base 601 has been removed. In one embodiment, the material has been removed by a punching machine. The remaining material of the conductive base 601 forms the circuit of the present invention. Alternatively, the circuit may be printed on the conductive base 601 and then an etching process is used to remove the areas 602. The pilot holes 605 on the conductive base 600 act as a guide for manufacture and assembly.

Figure 6B:
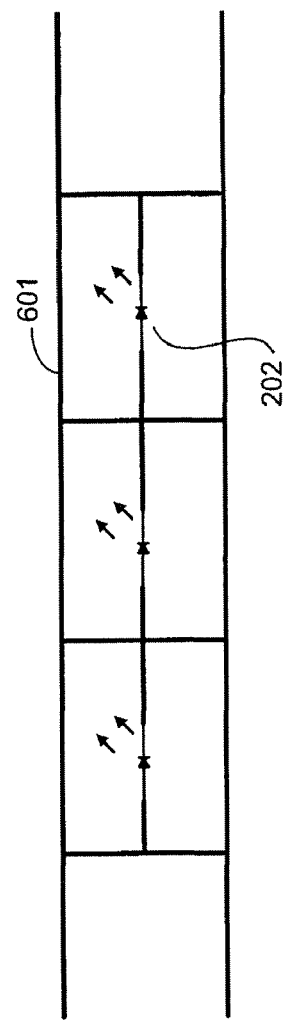
FIG. 6B is a schematic diagram of the conductive base of FIG. 6A.

The LEDs 202 are mounted either by surface mounting or LED chip bonding and soldered, welded, riveted or otherwise electrically connected to the conductive base 601 as shown in FIG. 6A. The mounting and soldering of the LEDs 202 onto the conductive base 601 not only puts the LEDs 202 into the circuit, but also uses the LEDs 202 to mechanically hold the different unpunched parts of the conductive base 601 together. In this embodiment of the conductive base 601 all of the LEDs 202 are short-circuited, as shown in FIG. 6B. Thus, additional portions of conductive base 601 are removed as discussed below so that the LEDs 202 are not short-circuited. In one embodiment, the material from the conductive base 601 is removed after the LEDs 202 are mounted.

Second Embodiment of the Conductive Base

Figure 7A:
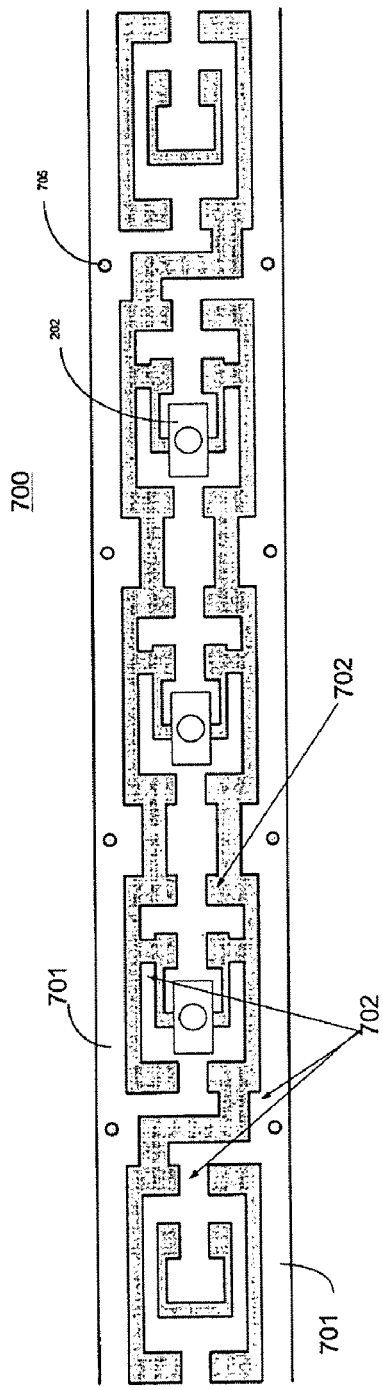
FIG. 7A is an embodiment of the conductive base.
Figure 7B:
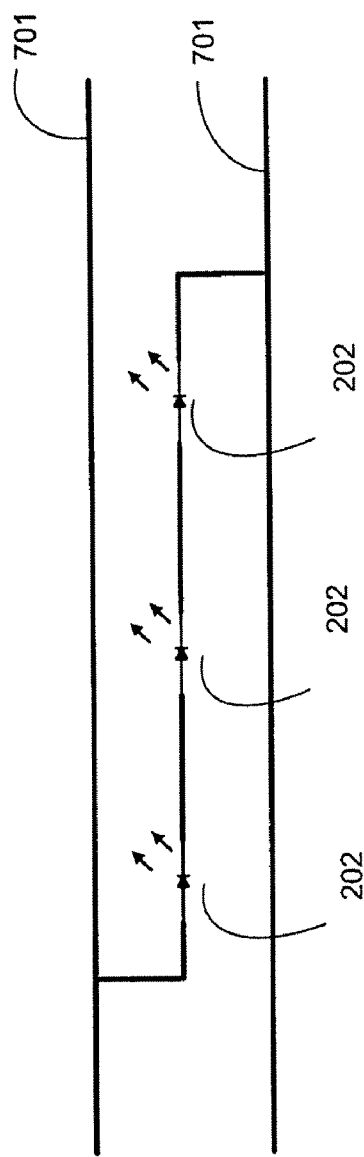
FIG. 7B is a schematic diagram of the conductive base of FIG. 7A.

To create series and/or parallel circuitries, additional material is removed from the conductive base. As shown in FIG. 7A, the conductive base 701 has an alternative hole pattern 702 relative to the hole pattern 602 depicted in FIG. 6A. With the alternative hole pattern 702, the LEDs 202 are connected in series on the conductive base 701. The series connection is shown in FIG. 7B, which is a schematic diagram of the conductive base assembly 700 shown in FIG. 7A. As shown, the mounting portions of LEDs 202 provide support for the conductive base 701.

Third Embodiment of the Conductive Base

Figure 8A:
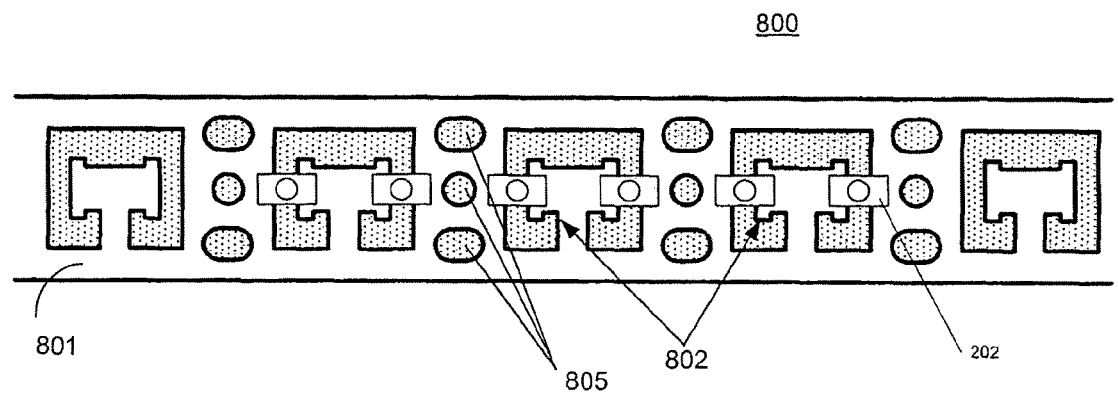
FIG. 8A is an embodiment of the conductive base.
Figure 8B:
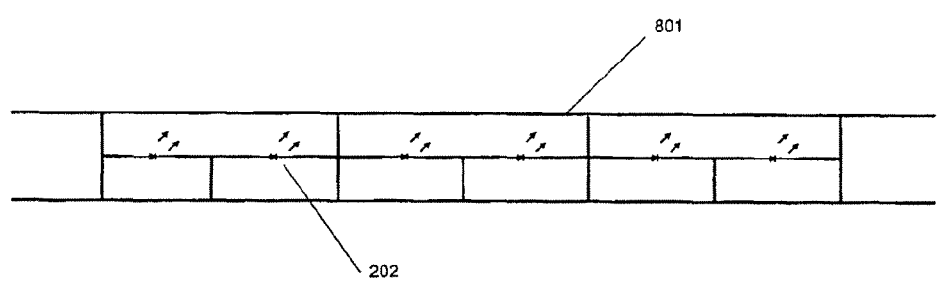
FIG. 8B is a schematic diagram of the conductive base of FIG. 8A.

In a third embodiment of the conductive base, as shown in FIG. 8A, a conductive base assembly 800 is depicted having a pattern 802 is punched out or etched into the conductive base 801. Pattern 802 reduces the number of punched-out gaps required and increase the spacing between such gaps. Pilot holes 805 act as a guide for the manufacturing and assembly process. As shown in FIG. 8B, the LEDs 202 are short-circuited without the removal of additional material. In one embodiment, the material from conductive base 801 is removed after the LEDs 202 are mounted.

Fourth Embodiment of the Conductive Base

Figure 9A:
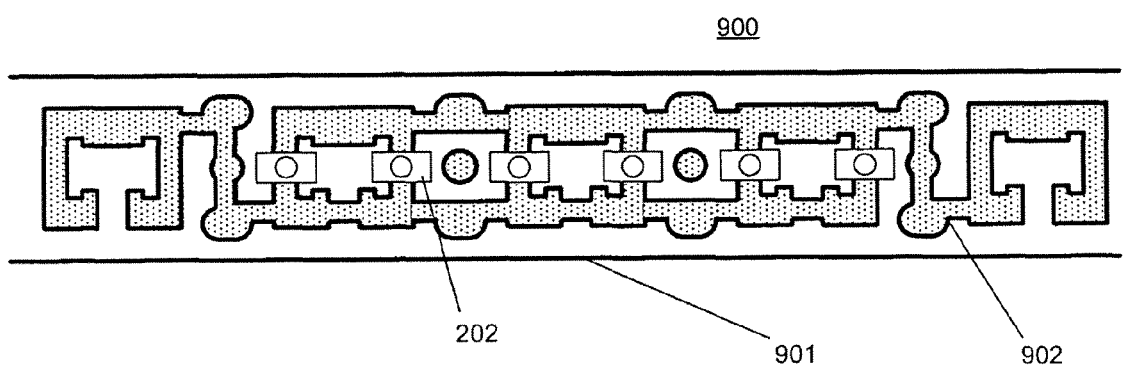
FIG. 9A is an embodiment of the conductive base.
Figure 9B:
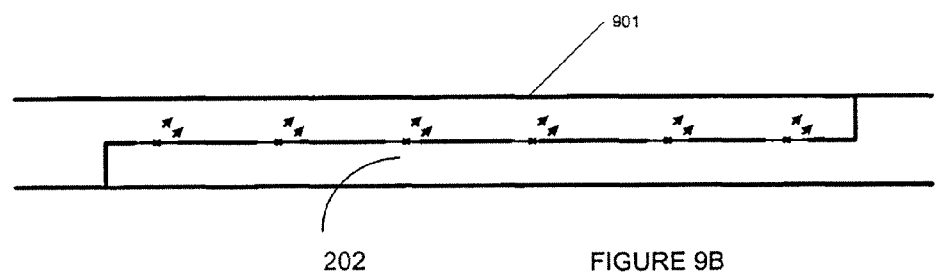
FIG. 9B is a schematic diagram of the conductive base of FIG. 9A.

As illustrated in FIG. 9A, a fourth embodiment of the conductive base assembly 900 contains an alternative hole pattern 902 that, in one embodiment, is absent of any pilot holes. Compared to the third embodiment, more gaps are punched out in order to create two conducting portions in the conductive base 901. Thus, as shown in FIG. 9B, this embodiment has a working circuit where the LEDs 202 connected in series.

Fifth and Sixth Embodiments of the Conductive Base

Figure 10A:
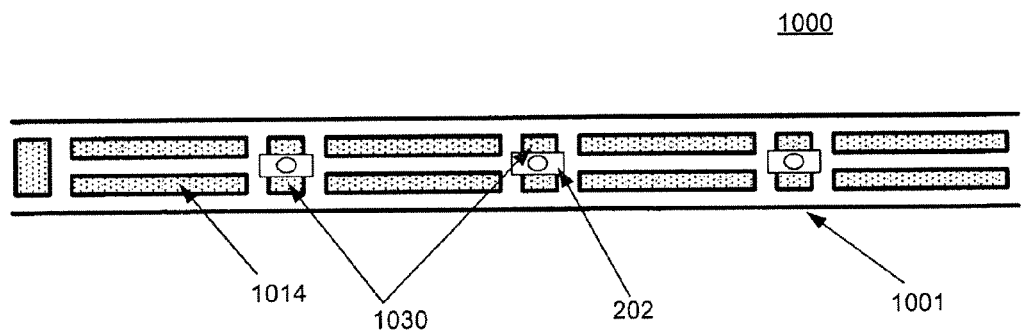
FIG. 10A is an embodiment of the conductive base.
Figure 10B:
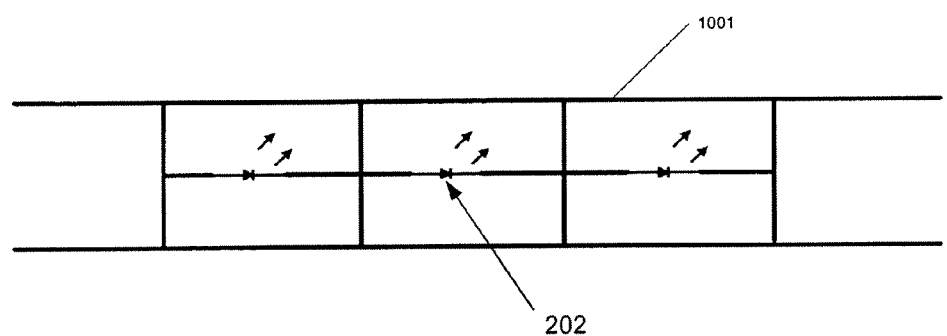
FIG. 10B is a schematic diagram of the conductive base of FIG. 10A.

FIG. 10A illustrates a fifth embodiment of conductive base assembly 1000 of the conductive base 1001. Shown is a thin LED light wire with a typical outer diameter of 3 mm or less. As shown in FIG. 10A, (1) the LEDs 202 connected on the conductive base 1001 are placed apart, preferably at a predetermined distance. In a typical application, the LEDs 202 are spaced from 3 cm to 1 m, depending upon, among other things, at least the power of the LEDs used and whether such LEDs are top or side-emitting. The conductive base 1001 is shown absent of any pilot holes. The punched-out gaps that create a first hole pattern 1014 that are straightened into long thin rectangular shapes. LEDs 202 are mounted over punched-out gaps 1030. However, as shown in FIG. 10B, the resultant circuit for this embodiment is not useful since all the LEDs 202 are short-circuited. In subsequent procedures, additional material is removed from conductive base 1001 so that LEDs 202 are in series or parallel as desired.

Figure 11A:
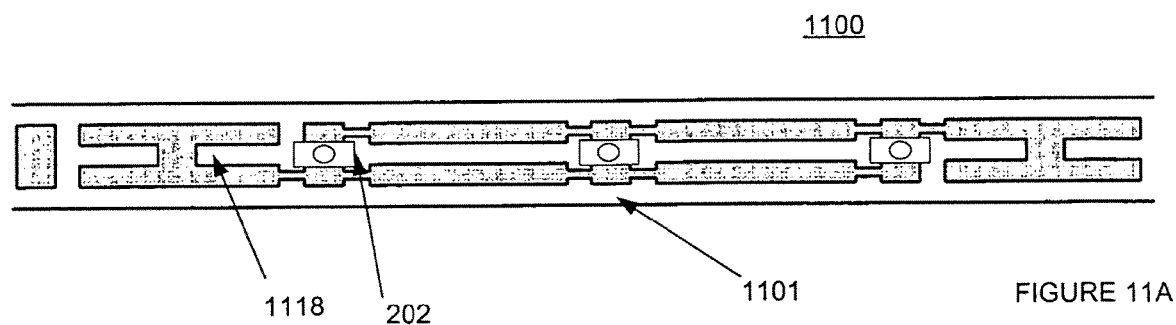
FIG. 11A is an embodiment of the conductive base.
Figure 11B:
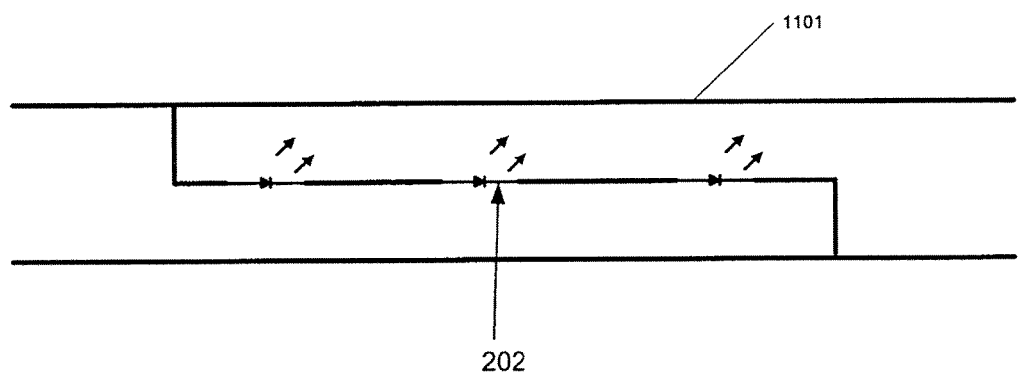
FIG. 11B is a schematic diagram of the conductive base of FIG. 11A.

In the sixth embodiment of the conductive base assembly 1100, conductive base 1101, as shown in FIG. 11A, contains a hole pattern 1118 which creates a working circuit in the conductive base 1101 with a series connections of LEDs 202 mounted onto the conductive base 1101. This embodiment is useful in creating a thin LED light wire with a typical outside diameter of 3 mm or less.

LEDs

The LEDs 202 may be, but are not limited to, individually-packaged LEDs, chip-on-board ("COB") LEDs, or LED dies individually die-bonded to the conductive base 301. The LEDs 202 may also be top-emitting LEDs, side-emitting LEDs, side view LEDs, or a combination thereof. In a preferred embodiment, LEDs 202 are side-emitting LEDs and/or side view LEDs.

The LEDs 202 are not limited to single colored LEDs. Multiple-colored LEDs may also be used. For example, if Red/Blue/Green LEDs (RGB LEDs) are used to create a pixel, combined with a variable luminance control, the colors at each pixel can combine to form a range of colors.

Mounting of LEDs onto the Conductive Base

As indicated above, LEDs 202 are mounted onto the conductive base by one of two methods, either surface mounting or LED chip bonding.

In surface mounting, as shown in FIG. 12, the conductive base 1201 is first punched to assume any one of the embodiments discussed above, and then stamped to create an LED mounting area 1210. The LED mounting area 1210 shown is exemplary, and other variations of the LED mounting area 1210 are possible. For example, the LED mounting area 1201 may be stamped into any shape which can hold an LED 202.

Figure 12A:
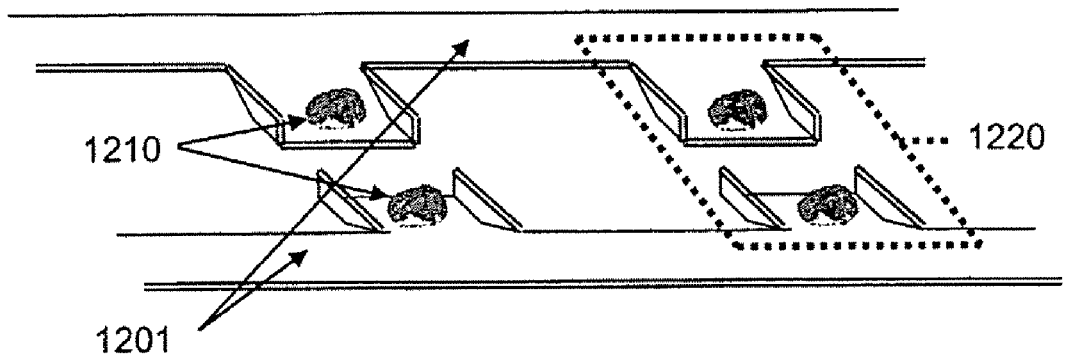
FIG. 12A depicts an embodiment of an LED mounting area of a conductive base.
Figure 12B:
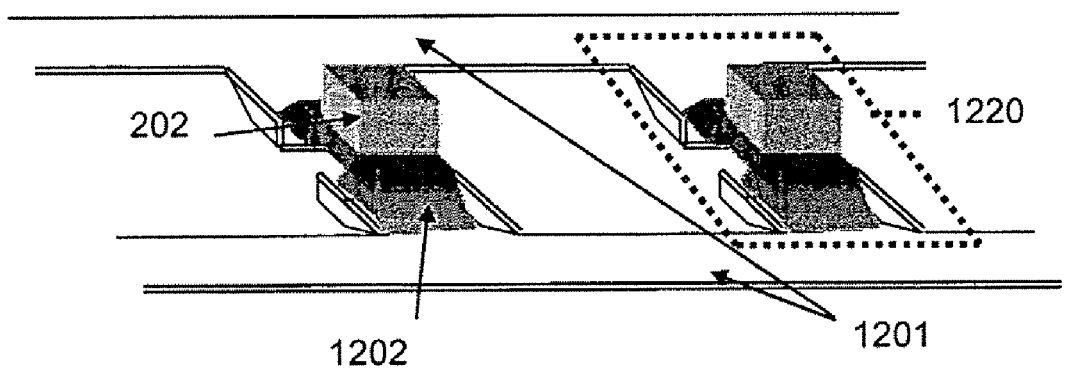
FIG. 12B depicts a mounted LED on a conductive base.

Alternatively, the LED mounting area 1220 may not be stamped, as shown in FIG. 12B. A soldering material 1210 (e.g., liquid solder; solder cream; solder paste; and any other soldering material known in the art) or conductive epoxy is placed either manually or by a programmable assembly system in the LED mounting area 1220, as illustrated in FIG. 12A. LEDs 202 are then placed either manually or by a programmable pick and place station on top of the soldering material 1210 or a suitable conductive epoxy. The conductive base 1201 with a plurality of LEDs 202 individually mounted on top of the soldering material 1210 will directly go into a programmable reflow chamber where the soldering material 1210 is melted or a curing oven where the conductive epoxy is cured. As a result, the LEDs 202 are bonded to the conductive base 1201 as shown in FIG. 12B.

Figure 13:
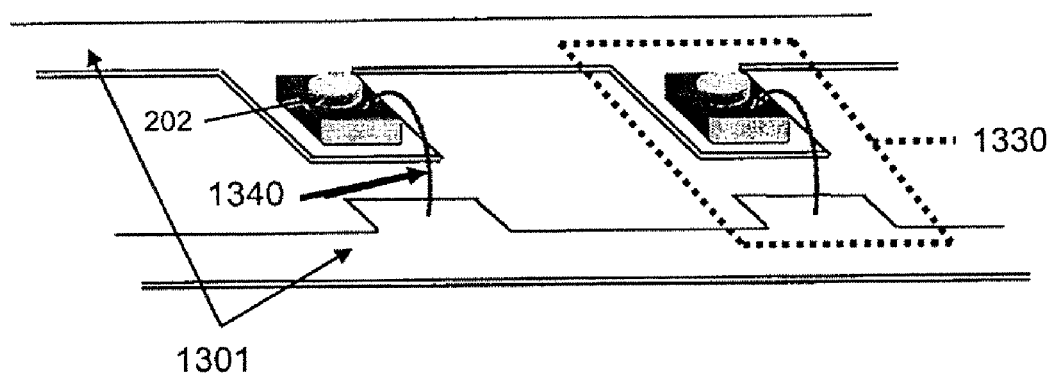
FIG. 13 depicts LED chip bonding in an LED mounting area.

As illustrated in FIG. 13, LEDs 202 may be mounted onto the conductive base 1301 by LED chip bonding. The conductive base 1301 is stamped to create a LED mounting area 1330. The LED mounting area 1330 shown in FIG. 13 is exemplary, and other variations of the LED mounting area 1330, including stamped shapes, like the one shown in FIG. 12A, which can hold an LED, are envisioned. LEDs 202, preferably an LED chip, are placed either manually or by a programmable LED pick place machine onto the LED mounting area 1330. The LEDs 202 are then wire bonded onto the conductive base 1301 using a wire 1340. It should be noted that wire bonding includes ball bonding, wedge bonding, and the like. Alternatively, LEDs 202 may be mounted onto the conductive base 301 using a conductive glue or a clamp.

It should be noted that the conductive base in the above embodiments can be twisted in an "S" shape. Then, the twisting is reversed in the opposite direction for another predetermined number of rotations; thereby, making the conductive base form a shape of a "Z". This "S-Z" twisted conductive base is then covered by an encapsulant. With its "S-Z" twisted placement, this embodiment will have increased flexibility, as well as emit light uniformly over 360°.

Figure 11C:
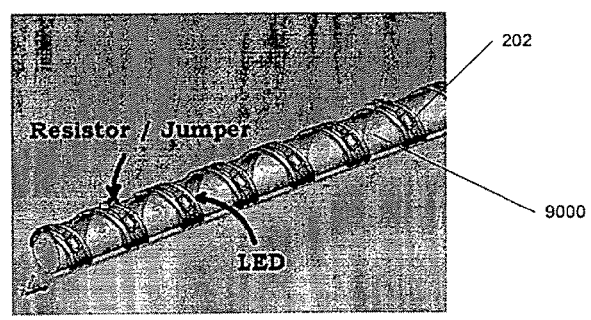
FIG. 11C depicts a conductive base wrapped on a core prior to encapsulation.

In another embodiment, as shown in FIG. 11C, conductive base (e.g., conductive base 1101) delivering electrical current to the LEDs is wound into spirals. The spiraling process can be carried out by a conventional spiraling machine, where the conductive base is placed on a rotating table and a core 9000 passes through a hole in the center of the table. The pitch of the LED is determined by the ratio of the rotation speed and linear speed of the spiraled assembly. The core 9000 may be in any three-dimensional shape, such as a cylinder, a rectangular prism, a cube, a cone, a triangular prism, and may be made of, but not limited to, polymeric materials such as polyvinyl chloride (PVC), polystyrene, ethylene vinyl acetate (EVA), polymethylmethacrylate (PMMA) or other similar materials or, in one embodiment, elastomer materials such as silicon rubber. The core 9000 may also be solid. In one embodiment, the conductive base delivering electrical current to the LEDs is wound into spirals on a solid plastic core and then encapsulated in a transparent elastomer encapsulant.

Encapsulant

The encapsulant provides protection against environmental elements, such as water and dust, and damage due to loads placed on the integral LED light wire. The encapsulant may be flexible or rigid, and transparent, semi-transparent, opaque, and/or colored. The encapsulant may be made of, but not limited to, polymeric materials such as polyvinyl chloride (PVC), polystyrene, ethylene vinyl acetate (EVA), polymethylmethacrylate (PMMA) or other similar materials or, in one embodiment, elastomer materials such as silicon rubber.

Fabrication techniques concerning the encapsulant include, without limitation, extrusion, casting, molding, laminating, or a combination thereof. The preferred fabrication technique for the present invention is extrusion.

Figure 14:
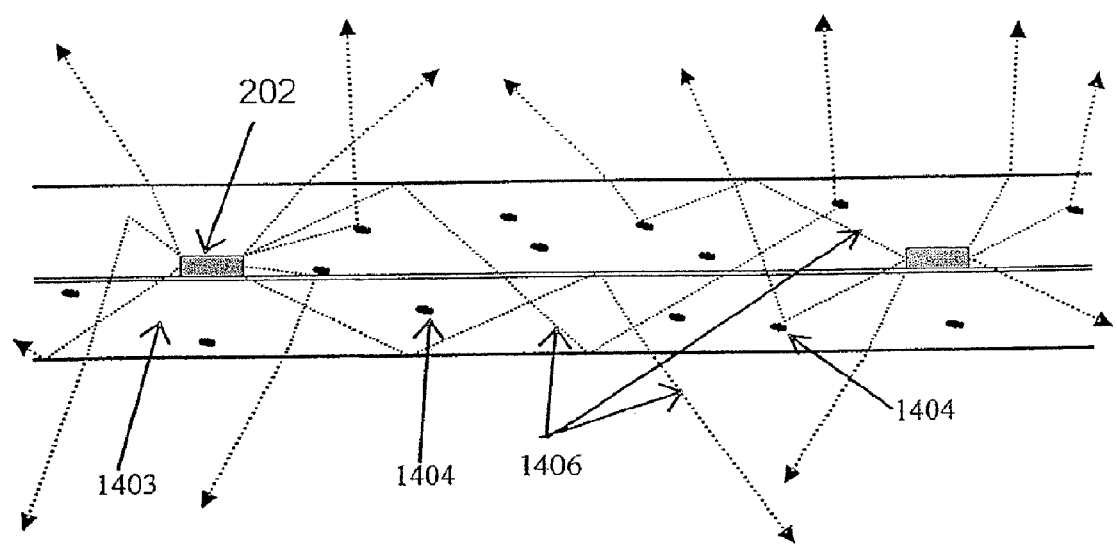
FIG. 14 depicts the optical properties of an embodiment of the invention.

In addition to its protective properties, the encapsulant assists in the scattering and guiding of light in the LED light wire. As illustrated in FIG. 14, that part of the light from the LEDs 202 which satisfies the total internal reflection condition will be reflected on the surface of the encapsulant 1403 and transmitted longitudinally along the encapsulant 1403. Light scattering particles 1404 may be included in the encapsulant 1403 to redirect such parts of the light as shown by light path 1406. The light scattering particles 1404 are of a size chosen for the wavelength of the light emitted from the LEDs. In a typical application, the light scattering particles 1404 have a diameter in the scale of nanometers and they can be added to the polymer either before or during the extrusion process.

The light scattering particles 1404 may also be a chemical by-product associated with the preparation of the encapsulant 1403. Any material that has a particle size (e.g., a diameter in the scale of nanometers) which permits light to scatter in a forward direction can be a light scattering particle.

The concentration of the light scattering particles 1404 is varied by adding or removing the particles. For example, the light scattering particles 1404 may be in the form of a dopant added to the starting material(s) before or during the extrusion process. The concentration of the light scattering material 1404 within the encapsulant 1403 is influenced by the distance between LEDs, the brightness of the LEDs, and the uniformity of the light. A higher concentration of light scattering material 1404 may increase the distance between neighboring LEDs 202 within the LED light wire. The brightness of the LED light wire may be increased by employing a high concentration of light scattering material 1404 together within closer spacing of the LEDs 202 and/or using brighter LEDs 202. The smoothness and uniformity of the light within the LED light wire can be improved by increasing the concentration of light scattering material 1404 may increase such smoothness and uniformity.

As shown in FIGS. 3 and 5 the sub-assemblies 310 and 510 are substantially at the center of the encapsulant. The sub-assemblies 310 and 510 are not limited to this location within the encapsulant. The sub-assemblies 310 and 510 may be located anywhere within the encapsulant. Additionally, the cross-sectional profile of the encapsulant is not restricted to circular or oval shapes, and may be any shape (e.g., square, rectangular, trapezoidal, star). Also, the cross-sectional profile of the encapsulant may be optimized to provide tensing for light emitted by the LEDs 202. For example, another thin layer of encapsulant may be added outside the original encapsulant to further control the uniformity of the emitted light from the present invention.

Surface Texturing and Lensing

The surface of the integral LED light wire can be textured and/or tensed for optical effects. The integral single piece LED light wire may be coated (e.g., with a fluorescent material), or include additional layers to control the optical properties (e.g., the diffusion and consistency of illuminance) of the LED light wire. Additionally, a mask may be applied to the outside of the encapsulant to provide different textures or patterns.

Different design shapes or patterns may also be created at the surface of the encapsulant by means of hot embossing, stamping, printing and/or cutting techniques to provide special functions such as lensing, focusing, and/or scattering effects. As shown in FIGS. 15A-C, the present invention includes formal or organic shapes or patterns (e.g., dome, waves, ridges) which influences light rays 1500 to collimate (FIG. 15A), focus (FIG. 15B), or scatter/diffuse (FIG. 15C). The surface of the encapsulant may be textured or stamped during or following extrusion to create additional lensing. Additionally, the encapsulant 303 may be made with multiple layers of different refractive index materials in order to control the degree of diffusion.

Applications of Integrally Formed Single Piece LED Light Wire

The present invention of the integrally formed single piece LED light wire finds many lighting applications. The following are some examples such as light wires with 360° Illumination, full color light wires, and light wires with individually controlled LEDs. It should be noted that these are only some of the possible light wire applications.

The three copper wires 161, 162, 163 delivering electrical power to the LEDs 202 shown in FIG. 16A forming the conductive base may be wound into spirals. The LEDs are connected to the conductors by soldering, ultrasonic welding or resistance welding. Each neighboring LED can be orientated at the same angle or be orientated at different angles. For example, one LED is facing the front, the next LED is facing the top, the third LED is facing the back, and the fourth one is facing the bottom etc. Thus, the integrally formed single piece LED light wire can illuminate the whole surrounding in 360°.

An embodiment of the integrally formed single piece LED light wire is shown in FIG. 16B. As shown there are two continuous conductors corresponding to conductors 161 and 163. Zero ohm jumpers or resistors couple conductor segments 162 to conductors 161 and 163 to provide power to LED elements 202. As shown in FIG. 16B, the integrally formed single piece LED light wire includes a substrate. In a preferred embodiment, the substrate is flexible. In another embodiment, the single piece light wire with flexible substrate is wound about a core 9000 (see, for example, FIG. 11C).

The integrally formed single piece LED light wire is not limited to single color. For full color application, the single color LED is replaced by an LED group consisting of four sub-LEDs in four different colors: red, blue, green, and white as shown in FIG. 17. The intensity of each LED group (one pixel) can be controlled by adjusting the voltage applied across each sub-LED. The intensity of each LED is controlled by a circuit such as the one shown in FIG. 18.

In FIG. 18, L1, L2, and L3 are the three signal wires for supplying electric powers to the four LEDs in each pixel. The color intensity of each sub-LED is controlled by a μController 6000 with the timing chart given in FIG. 19.

Figure 19:
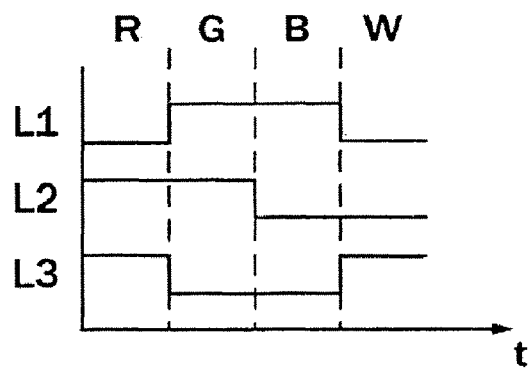
FIG. 19 is a timing diagram for a full color integrally formed single piece LED light wire.

As shown in FIG. 19, because the line voltage L2 is higher than the line voltage L1 over the first segment of time, the red LED (R) is turned on, whereas, during the same time interval, all the other LEDs are reverse biased and hence they are turned off. Similarly, in the second time interval, L2 is higher than L3 thus turning on the green LED (G) and turning off all the other LEDs. The turning on/off of other LEDs in subsequent time segments follows the same reasoning.

Figure 20A:
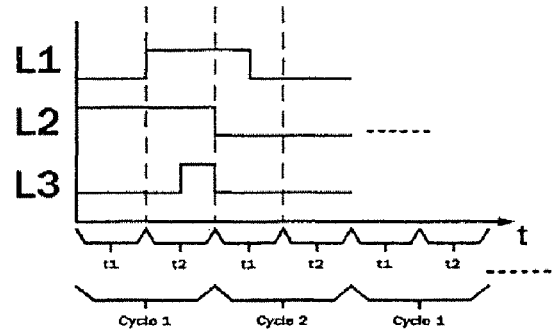
FIG. 20A is a timing diagram for a full color integrally formed single piece LED light wire.
Figure 20B:
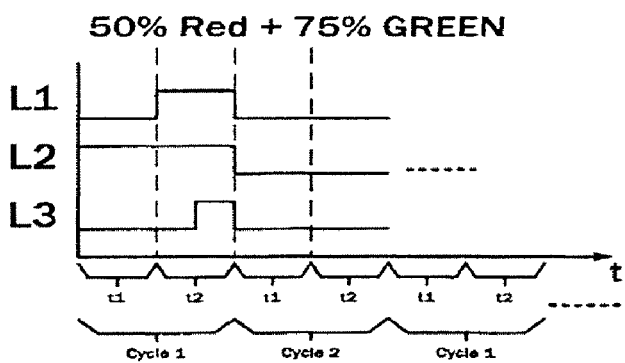
FIG. 20B is a timing diagram for a full color integrally formed single piece LED light wire.

New colors such as cold white and orange apart from the four basic ones can be obtained by mixing the appropriate basic colors over a fraction of a unit switching time. This can be achieved by programming a microprocessor built into the circuit. FIG. 20A and FIG. 20B show the timing diagrams of color rendering for cold white and orange respectively. It should be noted that the entire color spectrum can be represented by varying the timing of signals L1, L2, and L3.

Figure 21:
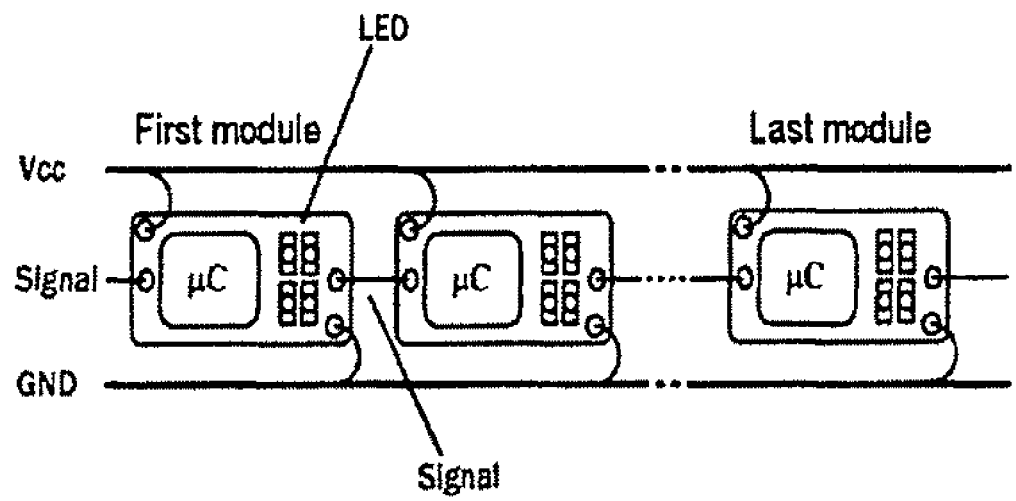
FIG. 21 depicts an LED module.

In one embodiment of the invention, each pixel of LEDs can be controlled independently using a microprocessor circuit into the light wire as shown in FIG. 21. Each LED module 2100 is assigned a unique address. When this address is triggered, that LED module is lit up. It will be noted that each pixel is an LED module consists of a micro-controller and three (RGB) or four (RGBW) LEDs. The LED modules are serially connected with a signal wire based on daisy chain or star bus configuration. Alternatively, the LED modules 2100 are arranged in parallel.

There are two ways to assign an address for each LED module. In a first approach, a unique address for each pixel is assigned during the manufacturing process. In a second approach, each pixel is assigned an address dynamically with its own unique address and each pixel being characterized by its own "address" periodically with trigger signal. Alternatively, the address is assigned dynamically when powered on. The dynamic addressing has the advantage of easy installation, as the integrally formed single piece LED light wire can be cut to any length. In one embodiment, the light wire can be cut into any desired length while it is powered on and functioning.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrally-formed light wire, comprising:
   a first bus element formed from a conductive material adapted to distribute power from a power source;
   a second bus element formed from a conductive material adapted to distribute power from the power source;
   a third bus element formed from a conductive material adapted to distribute a control signal;
   a plurality of light emitting diode (LED) modules, each of said plurality of LED modules comprising a microcontroller and at least one LED, each LED module having first, second, and third electrical contacts mounted on and electrically coupled to the first, second, and third bus elements, respectively, to draw power from the first and second bus elements and to receive a control signal from the third bus element; and
   a continuous unitary encapsulant completely and continuously encapsulating said first, second, and third bus elements, and said plurality of LED modules, including said respective microcontrollers, wherein said unitary encapsulant has a constant cross-sectional area throughout its length.

2. The integrally-formed light wire of claim 1, wherein the encapsulant further comprises light scattering particles.

3. The integrally-formed light wire of claim 1, wherein a connection between each of the plurality of LED modules and one of the first and second bus elements is selected from the group consisting of solder, weld, and conductive epoxy.

4. The integrally-formed light wire of claim 3, wherein a connection between each of the plurality of LED modules and another of the first and second bus elements is selected from the group consisting of solder, weld, wire bonding, and conductive epoxy.

5. The integrally-formed light wire of claim 1, wherein each of the plurality of LED modules further comprises a plurality of LEDs, wherein the plurality of LEDs are selected from the group consisting of red, blue, green, and white LEDs.

6. The integrally-formed light wire of claim 1, wherein each of the plurality of LED modules further comprises a fourth contact for outputting the received control signal.

7. The integrally-formed light wire of claim 1, wherein each LED module has a unique address used to control the LED module.

8. The integrally-formed light wire of claim 7, wherein the address is static.

9. The integrally-formed light wire of claim 7, wherein the address is dynamic.

* * * * *